(12) United States Patent
Pflüger et al.

(10) Patent No.: US 6,192,504 B1
(45) Date of Patent: Feb. 20, 2001

(54) METHODS AND SYSTEMS FOR FUNCTIONALLY DESCRIBING A DIGITAL HARDWARE DESIGN AND FOR CONVERTING A FUNCTIONAL SPECIFICATION OF SAME INTO A NETLIST

(75) Inventors: Thomas Pflüger, Leinfelden; Klaus-Dieter Schubert, Sindelfingen, both of (DE)

(73) Assignee: International Business Machines Corporation, Armonk, NY (US)

( * ) Notice: Under 35 U.S.C. 154(b), the term of this patent shall be extended for 0 days.

(21) Appl. No.: 09/014,177

(22) Filed: Jan. 27, 1998

(30) Foreign Application Priority Data

May 14, 1997 (EP) .................................................. 97107844

(51) Int. Cl.[7] .................................................. G06F 17/50
(52) U.S. Cl. .................................... 716/1; 716/3; 716/18
(58) Field of Search .................... 395/500.02, 500.04, 395/500.19; 716/1, 3, 18

(56) References Cited

U.S. PATENT DOCUMENTS

| | | | | |
|---|---|---|---|---|
| 5,490,082 | * | 2/1996 | Rowson | 716/11 |
| 5,764,532 | * | 6/1998 | Patel | 716/9 |
| 5,774,370 | * | 6/1998 | Giomi | 716/4 |
| 5,801,958 | * | 9/1998 | Dangelo et al. | 716/18 |

* cited by examiner

Primary Examiner—Matthew Smith
Assistant Examiner—Vuthe Siek
(74) Attorney, Agent, or Firm—Paul J. Otterstedt

(57) ABSTRACT

Disclosed is a hardware design development tool, where in a first step the data flow (30) of the desired hardware design is specified (10, 40) and structured into functions. Then the required control logic (31, 32) is introduced in those functions in order to get a description of the functional behavior of the underlying hardware. Various interconnections or relationships are provided between data flow and control logic, for instance via calls (33) between them. According to the proposed methodological steps, the design is specified (10, 40) by functions depending on variables, wherein the functions contain data flow and control flow information. The functional description is parsed (43) in order to distinguish data flow and control flow information. In particular, at least one local table (45) each entry of which containing the control flow information, and a global table (46) each entry of which containing the data flow information and references to the local table(s), are provided. The development tool allows an automatic generation of a netlist from a high-level functional hardware description. Therefore a slow simulation on the low-level netlist stage is obsolete and the relatively fast simulation of the functional description is sufficient for testing the designed hardware.

14 Claims, 4 Drawing Sheets

METHODS AND SYSTEMS FOR FUNCTIONALLY DESCRIBING A DIGITAL HARDWARE DESIGN AND FOR CONVERTING A FUNCTIONAL SPECIFICATION OF SAME INTO A NETLIST

FIELD OF THE INVENTION

This invention generally relates to the design development of computer hardware and the simulation of electrical and logical behavior of digital hardware such as electronic circuits. In particular, the invention provides a method and an apparatus allowing to convert a functional description of digital hardware into a complete netlist.

BACKGROUND OF THE INVENTION

Traditional approaches for the design specification of computer hardware are based on either a netlist register transfer level (RTL) description or a functional hardware description. A functional description does not represent the detailed hardware layout with all interconnections and functional elements, but it is predominantly used to quickly provide a hardware specification which can be executed and examined or verified at the earliest development stage. Hereby the functional properties envisaged for the hardware are converted to functional features which are then linked together.

A functional specification can be set up in any programming language like 'C' or 'C++', but often specifically modified languages like 'BEHAVIOUR' are utilized to take particular hardware properties into account. After having been compiled for the target computer system, the functional specification can be used for the hardware simulation on a standard computer using an operating system like 'UNIX' (operating system developed at Bell laboratories, registered trademark of UNIX system laboratories). The functional description approach therefore allows to present complex hardware structures in a manner that enables to detect hardware failures as early as possible in the design phase.

In contrast to the above functional approach, a netlist description, in any case, is necessary to get a hardware product for the design. The netlists can be described by particular hardware description languages like 'DSL' (Hardware Design Language, developed at IBM development laboratory, Boeblingen, Germany) which is characterized by utilizing only one data structure namely bundles of conductors. Therefore, 'DSL' requires only attribute declarations for Input/Output features or clock signals. Storage elements like registers and arrays are regarded as blocks. The vocabulary of that language embraces only operators with a low hardware complexity like logic operators 'compare', 'if-then', 'add', and 'subtract'.

An other netlist description approach is 'VHDL', a programming language like 'ADA', which is extended by particular hardware operations. Accordingly, that language comprises a number of data structures and all statements of a common programming language like 'loop' statements. By the provision of particular statements for timing and signalling, 'VHDL' becomes a real hardware description language. One disadvantage of 'VHDL' is that simulation is event driven due to the required signal definitions.

The prementioned description languages are rather different from the predescribed functional approach with regard to the respective underlying methodology. A simulation procedure based on the functional approach executes the complete hardware sequentially function by function. However, for each state transition, not all functions have to be executed since most of them exclude each other.

In contrast to that, in the netlist approach, the hardware is described in parallel whereby functional relationships become not evident. Therefore, in order to simulate a netlist, the netlist description has to be analyzed, sorted, and stored as a design model in a particular data structure. Thereafter a simulator engine can execute that design model. But the functional properties of the simulated hardware are entirely lost. Therefore that approach is rather time consuming. But at this time, no method exists which enables a simple or even automatic conversion from a functional description of hardware to a correct and complete netlist. Therefore, for all designs, expensive netlist specifications have to be generated and verified manually.

Further, the design of today's complex digital signal processing systems increasingly relies on sophisticated design tools for a functional analysis and simulation. Recent work has been concerned with the integration of such simulation tools, wherein data flow-oriented approaches have proven to be very well suited for both tasks due to the nature of most digital signal processing applications. Further known is the integration of control flow into data flow oriented simulation and syntheses.

Various state-machine development tools for high-level design entry and simulation are known in the art in order to shorten the design time and to ensure the correctness of the simulation results. For the analysis of a typical computer design, the sequential control logic of the hardware system realized as finite state machines is one of the major design efforts.

An other major problem which is addressed e.g. in an article by A. Aziz et al. published in IEEE Computer Society Press, Los Alamitos, USA, and entitled "Minimizing Interacting Finite State Machines: A Compositional Approach to Language Containment", is compositional minimization of collections of interacting finite state machines that arise in the context of formal verification of hardware designs. It is recognized by the authors that much of the behavior of a designed system is redundant with respect to a given property being verified, and so the system can be replaced by substantially simpler representations. The authors show that these redundancies can be captured by computing states that are input-output equivalent in the presence of fairness. Since computing complete equivalences is computationally expensive, they further propose a spectrum of approximations which are efficiently computable. For instance, procedures are described that hierarchically minimize the system with respect to explicit representations.

Thereupon, a number of approaches in the field of translation of data flow information into a hardware description language are known. In an article by W. H. Chou and S. Y. Kung published in IEEE Computer Society Press, Los Alamitos, USA, and entitled "Register Transfer Modelling and Simulation for Array Processors", a register transfer modelling scheme is described where a data flow graph of the design is translated into a register transfer language which is further combined with a hardware description module. Hereby an interactive simulator is implemented to simulate the behavior of such a system.

Further, in an article by A. D. Gordon, published in IEEE Computer Society Press, Los Alamitos, USA, and entitled "The Formal Definition of a Synchronous Hardware-Description", a hardware verification method is described which provides connections between a language used in practice to design a circuit and an other language which is used for research into hardware verification. Hereby a simple data flow language is used for specifying digital signal processing circuits wherein a higher-order logic is extensively used for research into hardware verification. Particular, a combination of operational and predictive semantics is used to define formally a substantial subset of the data flow language by mapping that language definitions into the high-order logic predicates.

An other high-level hardware design environment is disclosed in an article by F. Rocheteau and N. Halbwachs published in Elsevier, Amsterdam, Netherlands, in 1992 and entitled "POLLUX: LUSTRE BASED HARDWARE DESIGNED ENVIRONMENT". Hereby a design description is written in a data-flow language, and used by a different tool to produce the corresponding synchronous circuit or a simulation program that can be compiled and executed on a sequential machine.

Beyond the above approaches, also object-oriented concepts for hardware description languages are already known, for instance, from an article by A. J. Van der Hoeven et al. published in IEEE Computer Society Press, Los Alamitos, USA, and entitled "A Hardware Designed System Based on Object-Oriented Principles". Most hardware description languages and their environments are either based on imperative language concepts or on functional language concepts. The hardware specification and simulation environment described in that article is based on object-oriented concepts such as classes, objects, inheritance, and abstraction. The underlying hardware design model uses also applicative state transitions to describe the functionality and data flow of a VLSI network.

A further object-oriented approach is disclosed in IBM TDB No. 12, 5/91, pages 435–436 entitled "State Machine Verification Expert". That expert system is conceived for generating all possible scenarios for a state-machine. The state-machine is described in the form of knowledge-based entities, wherein state transition rules are represented as forward-chaining rules. The system particularly provides a natural representation of the state-machine and uses some heuristic and causal knowledge to prune the surge space of the inputs and the state. Thus, it is possible for the expert system to test effectively all the combinations of the input signals and the possible states of the state-machine in a reasonable time. The described knowledge-based concept has the advantage that it can generate explanations for the behavior of the machine as time evolves, and it can mask out the details at a low level of operation of the machine to generate output only at a higher level. The object-oriented approach provides a classification of the data structures into hierarchies of units that represent an entity in the state-machine. The expert system generates a function that looks at the possible values of the control inputs and tries all possible combinations for the rules to filter through and generate scenarios.

Beyond the above approaches, from U.S. Pat. No. 5,369,594 an improved circuit design system and method is known. The circuit under simulation which may have both passive and active linear and non-linear elements is partitioned into sub-circuits such that some sub-circuits contain only linear elements. By this technique, simulation of large circuits containing large areas of passive components, the overall time for simulation is significantly reduced.

An other design method for the implementation of data-flow partitions in a high-level design of a chip making use of growable logical macrofunction library to describe data-flow and control logic partitions is disclosed in EP Application No. 91.480.167.5. That design method comprises a logic entry step to capture with a high-level language the design of the chip, making use of the logical macrofunction library to describe data-flow control logic partitions, a high-level logic simulation step using word model data that represent the logic behavior of the macrofunctions to simulate at high-level the behavior of the high-level logic, a structure extraction step to extract the pertinent physical data from the high-level logic using a word map that describes the physical placement of books within the macrofunctions and the logical models of the books, a book level logic verification step to make sure that the book level logic is consistent with the high-level logic, and besides other steps, a power assignment step using the book level logic to set up the correct level of power of the books contained in the book level logic.

Further, in an article published in IBM Technical Disclosure Bulletin (TDB) Volume 38 No. 7, 1995, pages 253–254, entitled "Method to Analyze Global Transient Phenomena Induced by Changes in the State of Very Large Simulation Models", an event simulator approach is described for a global analysis of a Central Processing Unit (CPU). The particular problems addressed there are long CPU run times and the analysis of transient variables like power, local heating, changes in power supply currents, voltage shifts on power supply busses, noise induced logic changes and noise induced analog circuit errors. The basic concept of that approach is to do an abstraction of what the design does at each state change.

An enhanced functional simulator to verify technology independent logic is described in IBM TDB No. 2, 7/91, pages 252–253, entitled "Hardware Cycle Simulation Coverage Measurement Tool". The analysis of the logic is based on a data flow analysis which checks how the logic BOOLEAN values are propagated and which verifies that latches and busses have correct values at specific times. Further a control flow analysis checks the sequences of switches and decision elements that lead to a logic state change. It verifies whether or not they have been activated during the simulation. In particular, a program is described which quantifies logic control flow activation during the simulation phase and thus permits validating the test case coverage.

A static flow analysis logic design is described in IBM TDB No.8, 1/91, pages 437–441. By means of a logic synthesis, conversion of a functional level hardware specification into a logic gate-level realization is performed. The logic synthesis system is used to convert the model to a basic design language for structure language representation. This gate-level representation allows for timing analysis to be done on the function. The hardware design cycle used to produce the chips starts with high-level functional specifications, timing requirements, and data-flow diagrams. Once these are complete, a software model of the functions is created using the basic design language. It is run through various timing analysis programs to verify that the timing of the hardware design is correct. Once both the function and the timing are verified, the logic design is complete. In a following step the physical design of the chip, i.e. the placement and wiring, is addressed. Finally, the chip is actually fabricated, tested, and returned to the logic designers.

A hardware design development system where the logic under simulation is partitioned into several functional islands which are developed in parallel is described in IBM TDB No. 7, 12/90, pages 247–251 entitled "Multi-Clock Rate Device for Hardware Simulation Efficiency Improvement". The simulation begins on isolated islands, than goes up with larger and larger structures to reach functions grouping different cards of a future machine. All the islands are not ready to be connected at the same time since many of problems occur on interfaces between these islands. Thus, at the beginning of a simulation project, simulation devices are defined that represent subsets of functions of different interfaces to allow the designers to simulate their logic before really interfaces are available.

An enhanced functional simulator which efficiently converts a parallel hardware description to a serial description for logic simulation, is disclosed in IBM TDB No. 11, 4/90, pages 354–361, entitled "Model Ordering for Compiled Enhanced Functional Simulator". Hardware models which are going to be simulated by a logic simulator, are segmented into clock sections. Each clock section is further broken into a signal block section and latch block section. Register transfer language statements are assigned to the slowest clock section possible that will still give correct behavior.

A simulation program which simulates dynamic performance of a large set of interconnected circuits is described in IBM TDB 2/73, pages 2973–2975. A design description is contained in a block using simulation library information to develop a simulation data base. The block uses well-known small signal circuit analysis techniques to develop equivalent circuits and netlists describing the circuit logic to be simulated. The output of the block provides the simulation data base which is formatted for efficient processing by a simulation algorithm. In particular, the simulation time is divided into discrete steps. The simulation algorithm treats individual logic circuits independently during a time step, because the time step is small compared to circuit transition times. During any one time step, only those circuits which might have a change in a state variable are simulated. Those circuits clearly quiescent are not simulated. The computation of the circuit responds for all of the individual logic circuits is performed serially by circuit for a single time step. Inputs to all circuits make use of the results just computed and any external signal changes during this time step. After all circuits have been analyzed, the results are placed in an event file and the time is incremented.

SUMMARY OF THE INVENTION

It is an object of the present invention to provide a method and a system which allow to convert a functional level description of a digital hardware design into a correct and complete netlist. In particular, the method shall be executed automatically.

A further object is to provide a hardware design method and system which avoid necessary simulation of the design at the low netlist level.

An other object is to provide a hardware simulator for computing a hardware design within a minimum time, also for the simulation of very complex designs.

According to the invention, as a first step for generating a netlist, a local netlist is provided based on fixed rules, which are described later in more detail. In addition, a global table of variables is set up in parallel. In a second step, for each variable, the functional hardware description is converted with respect to the according information contained in the global table, and all functional elements of the design are interconnected via their respective connections. In a last step, the required input and output information is added to the netlist. It is emphasized that local changes in the functional specification are represented also as local changes in the netlist.

The invention allows a fast simulation of even complex designs which are used, for instance, in the area of integrated CMOS chip technology. Of course, the invention can also be used for the design of less complex hardware like special purpose chips or control chips in all kinds of technical fields. Any abstract description of a hardware design based on control logic and data flow logic can be converted, without particular development efforts, into a netlist description of the hardware what can be performed even automatically. Therefore a manual generation of a netlist specification and a slow-speed simulation of the specification are not required any longer. Beyond that, no special hardware for accelerating the simulation is required.

Particularly, local changes of an underlying design correspond to local changes in the local netlist. But the global netlist itself remains unchanged since all global entries are anchored by fixed reference points in the local netlist.

Further it is needed to describe only a fraction of all possible logic states of the design although describing the design comprehensively. Beyond that, the simulation time required for testing a whole chip is dependent on the concurrent processes on a whole chip, and not on the total number of functions.

DETAILED DESCRIPTION OF THE INVENTION

Figure 1:
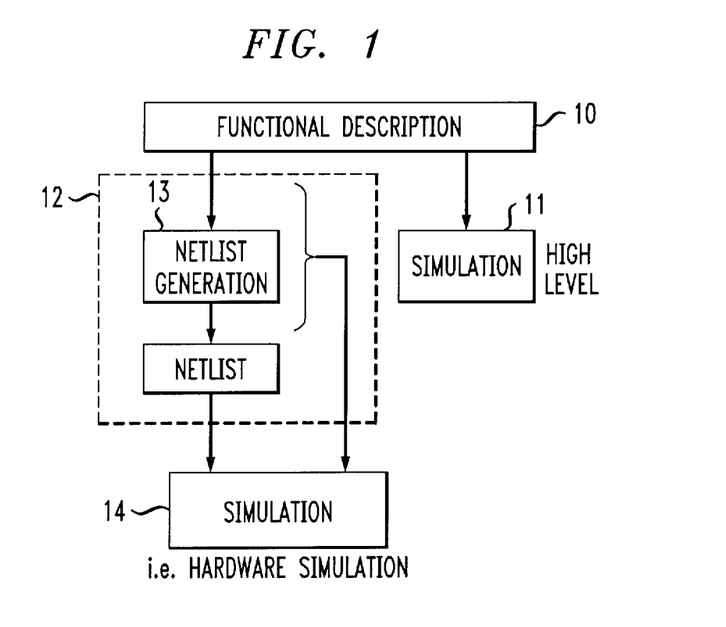
FIG. 1 is a block chart for comparing prior art netlist approaches with the preset invention.

Referring to the block diagram in FIG. 1, the simulation of a hardware design and the generation of a hardware netlist from a high-level functional hardware description according to the prior art is compared with the respective concepts underlying the present invention. The starting point for both the simulation and netlist generation is a high-level functional description 10 of a hardware design where hardware elements, like latches or registers, and functional features, like cycle times, are specified using a technique described in the following.

According to the prior art, the functional description 10 is used for a high-level simulation 11 of the designed hardware. However, the simulation results can only be used for the understanding of the underlying functionality and performance of the designed hardware. The simulation, for instance, concerns verification of the used µ-code, performance measurement of the designed hardware, or verification of designed application programs.

Therefore, in the prior art, beyond the simulation step, a further step 12 is needed for the development of hardware, e.g. by means of generating 13 a netlist. Since that second step 12 is independent from the first step 11, the results of the simulation can not directly be used for the netlist generation, but only as background information for the hardware designer. In particular, the netlists themselves have to be generated by manual optimizing steps.

In contrast to the known approaches, the netlist conversion mechanism according to the invention allows to generate a netlist automatically, i.e. without the requirement of any user interaction, from a high-level functional description 10. Therefore a slow simulation on the low-level netlist stage is obsolete and the relatively fast simulation 14 of the functional description is sufficient for testing the designed hardware.

Figure 2:
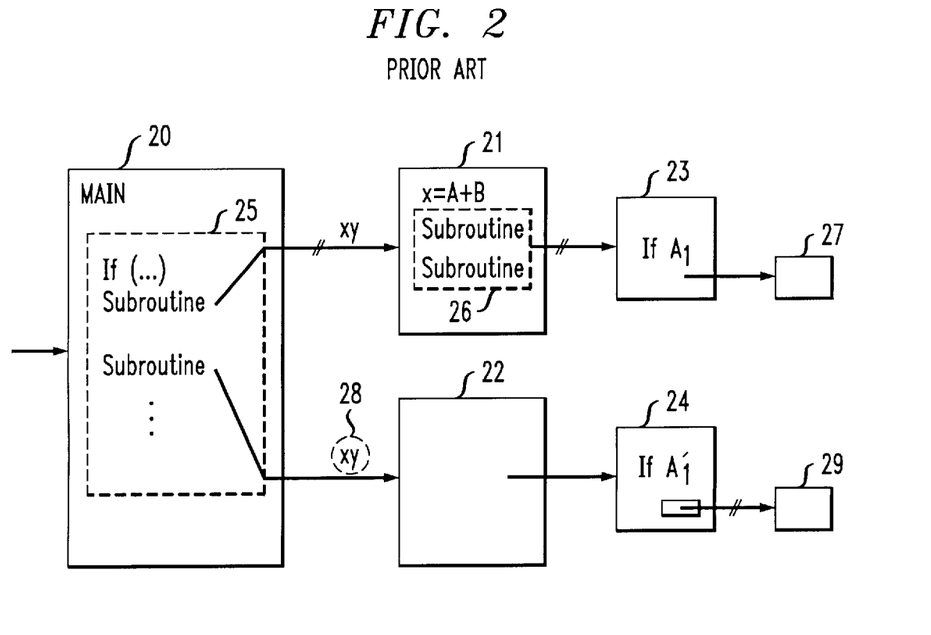
FIG. 2 is a block diagram illustrating a common application program structure according to the prior art.

To illustrate 'BEHAVIOR', the block diagram depicted in FIG. 2 shows a common program structure comprising a main program 20 and two exemplary subroutines 21, 22 which are called by the main program 20, respectively, during program execution. The subroutines 21, 22 themselves call further subroutines 23, 24, etc. A branch instruction 25 determines which of the subroutines 21, 22 is called based on a present condition In the running main program 20. In parallel with calling the subroutine 21, fixed values of variables x, y are also transferred from the main program 20 to the subroutine 21. Accordingly, a further branch instruction 26 contained in the first subroutine 21 calls an other subroutine 23 in case of a second certain condition being fulfilled. Accordingly a last subroutine 27 in the line of subroutines is called.

According to the depicted program, along the second subroutine path starting with subroutine 22, a second set 28 of values for the variables X and Y is transferred. A particular consequence is that in the third subroutine 29 a condition 'A1' is never fulfilled i.e. the jumping rate in a further performed simulation process would be 'zero'. Thus simulation of that state is redundant and consumes only simulation time, but has no positive effect for the simulation results themselves.

Figure 3:
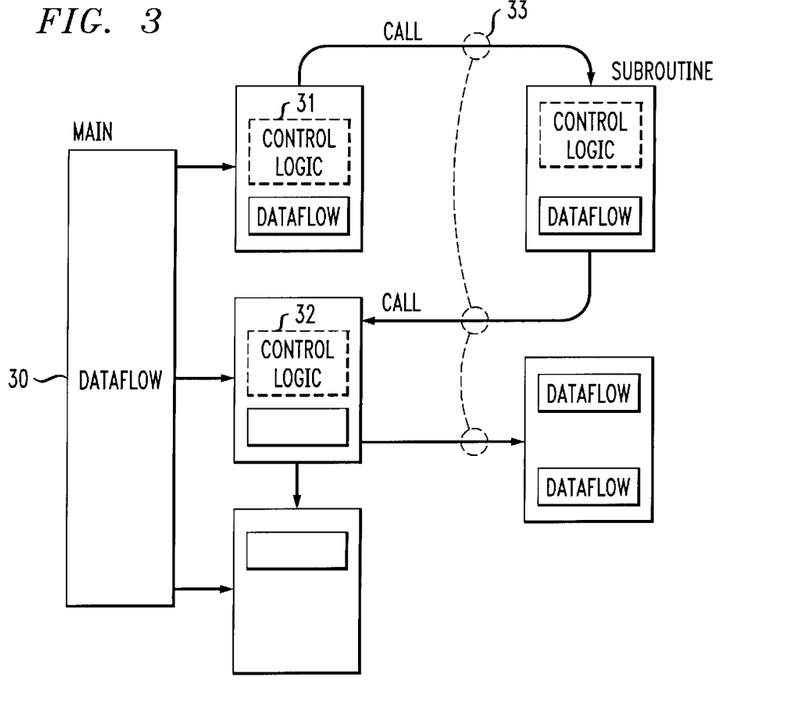
FIG. 3 is a flow chart depicting a netlist conversion mechanism and the respective information flow according to a preferred embodiment of the invention.

The block diagram in FIG. 3 shows a preferred input format structure for the data flow and control logic information of a functional description of a hardware design. In a first step, the data flow 30 of the desired hardware design is specified and structured into functions. Then the required control logic 31, 32 is introduced in those functions in order to get a description of the functional behavior of the underlying hardware. It is hereby emphasized that there exist various interconnections or relationships between data flow and control logic, for instance via calls 33 between them. The control logic 31, 32 may be distributed into several functions. It is also possible that some functions do not contain data flow at all, e.g. a main routine performing principle decisions.

It is noted hereby that the underlying concept of the proposed concept is a hardware description that distinguishes between data flow and control flow. Data flow can be for example assigning a value to a variable, wherein control flow means e.g. a conditional program statement.

In the following, a preferred embodiment of the present invention is illustrated with reference to the schematic flow diagram depicted in FIG. 4. The diagram shows the elements of a conversion device for transferring a high-level functional hardware description 40 into a low-level netlist (description) 41 whereby the conversion is accomplished automatically and independently from any interaction by a user. The device can be realized either as hardware or as a computer program provided on a data carrier for execution in a digital computer.

Therefore, in a first step each statement 42 of the high-level functional description 40, e.g. a function F(x, y) dependent on variables x and y, is parsed 43 in order to distinguish 44 data flow from control flow statements. According to the results of that parsing 43, the regarded statement is either transferred to a local netlist 45 containing e.g. conditional clauses or input conditions, or to a global table 46 containing assignments and function calls.

It is further noted hereby that, in a hardware specification based on a functional behavior, the data flow is already determined, but the control logic for realizing that data flow is distributed across the design and can not be inspected in total.

Figure 4:
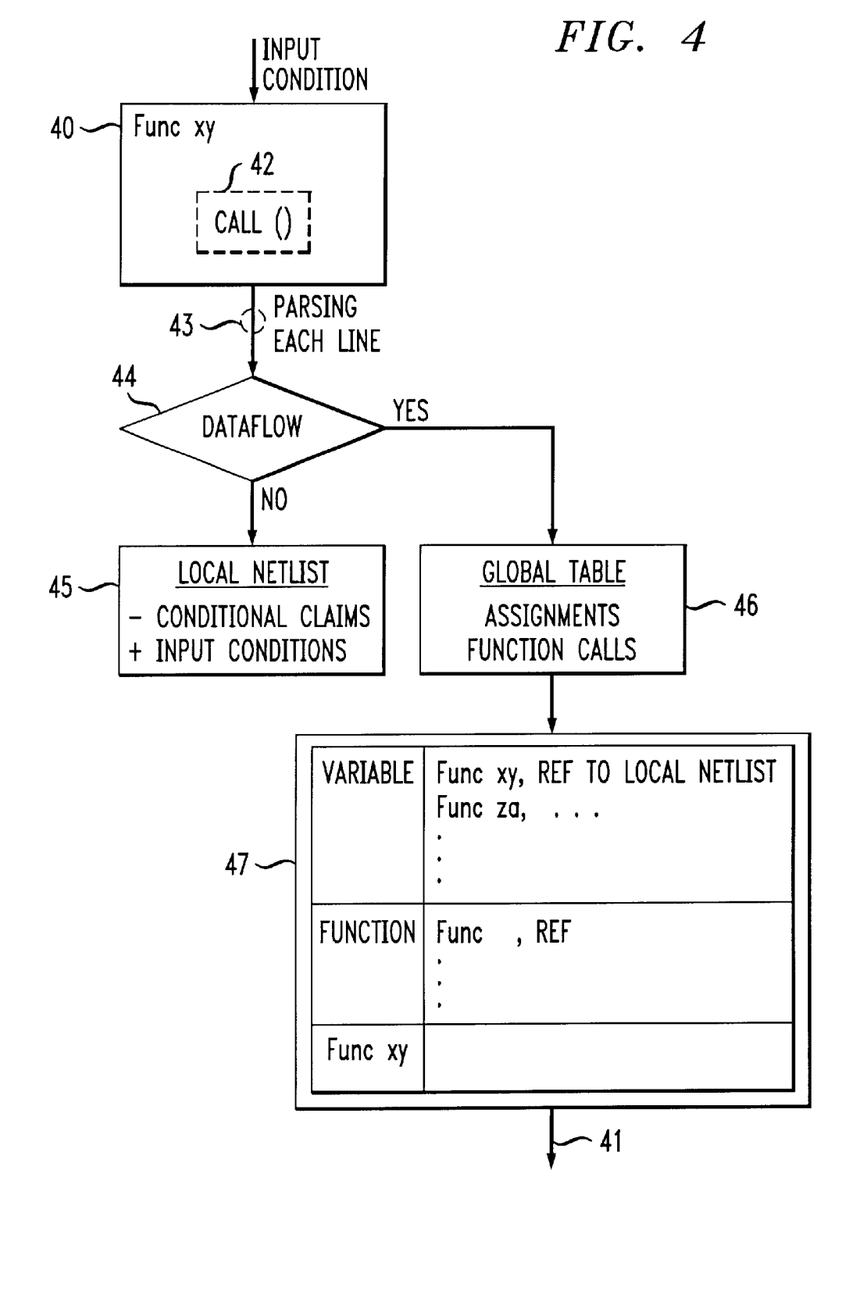
FIG. 4 is a preferred input data format for the data flow and control logic information used for a functional description of a hardware design according to the invention.

The local netlist 45 shown in FIG. 4 contains all combinatorical logic of the design, including all decoders and data dependent switches. It also provides a standardized format for the data flow inputs to help generating the global netlist. An example for these kind of statements can be found in FIG. 5a. The standardized format functions as an anchor to link together the global netlist and the local netlist.

Further, FIG. 4 depicts also an exemplary global table 47 according to the preferred embodiment of the invention. The entries of the global table are, for each variable, the respective functions together with respective references to the local netlist. Similar entries are provided for the functions themselves defined in the underlying functional hardware description. For each variable a particular netlist entry is generated. The netlist entry represents the multiplexer at the input of the variable. This is typically an 'AND_OR' circuit (see also FIG. 7). The 'AND' portion is already covered by the standardized format in the local netlist. But the 'OR' portion is generated for the global netlist (FIG. 5c). To generate this global netlist, according to the invention, a global table is provided. This table contains entries where each entry consists of the following information (for an example see FIG. 5b):

a) The function that has been parsed when generating the entry together with a condition number referring to a state within this function (this is required to reference later on to the local netlist);

b) in addition, the name of the variable is saved to have the opportunity to combine all entries which refer to the same variable; and c) a counter to distinguish between entries which would be identical otherwise.

Figure 5A:
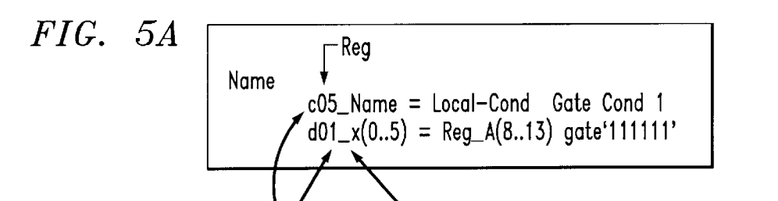
FIG. 5a shows typical entries of the local netlist and the references to the global table according to the invention.
Figure 5B:
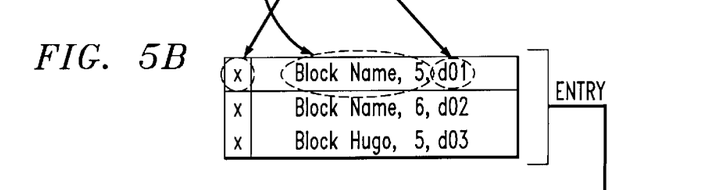
FIG. 5b is a preferred entry format of the global table according to the invention.
Figure 5C:
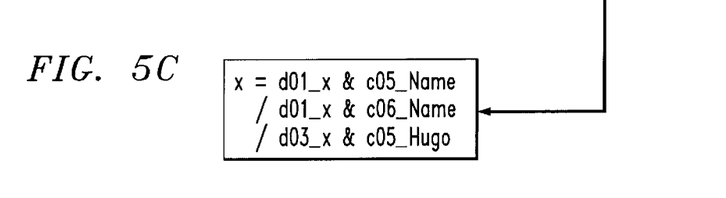
FIG. 5c are exemplary global netlist statements according to the prior art.

Therefore, only for illustration purposes, FIGS. 5a–c show different data formats used for name definitions, exemplary entries for a variable X in the global table, and according netlist entries for the variable X.

Figure 6:
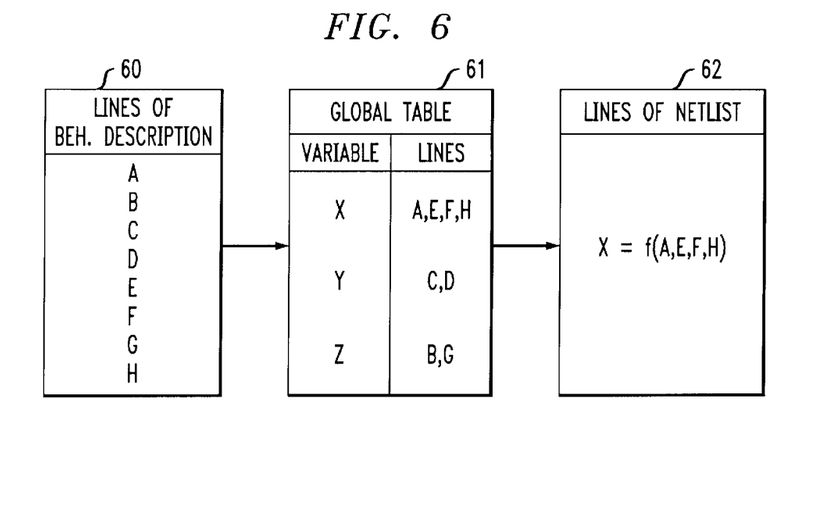
FIG. 6 serves to illustrate the conversion of sequential statements of the functional hardware description into netlist statements according to the invention.

FIG. 6 serves to illustrate the conversion of sequential statements 60 of the functional hardware description into the netlist statements by reordering the statements by using a global table 61. The global table 61 serves as a medium to collect the information for one variable across the design. The collected information can then be used to generate the complete netlist statements 62 for the variable.

Figure 7:
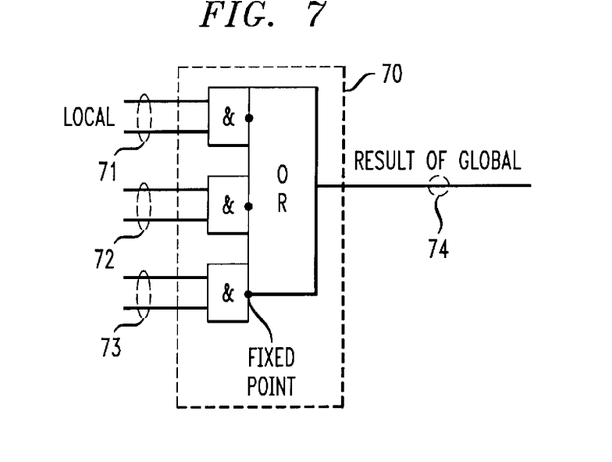
FIG. 7 illustrates, with reference to FIGS. 5a–c, representation of variables of the functional description by multiplexer means.

It is emphasized that the functional description implicitly contains one or more multiplexers which are not perceivable by any statement in the functional description. This is illustrated in FIG. 7 which depicts a multiplexer 70 with three logical inputs 71, 72, 73 and one logical output 74. The according inputs are taken from the local netlist (table) and are first 'AND'ed. The respective results are then 'ORed' and the according results forwarded to the global netlist.

Figure 8:
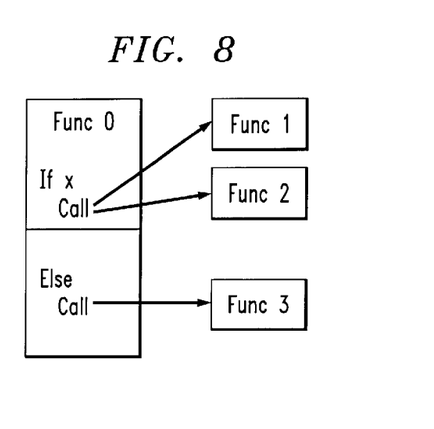
FIG. 8 illustrates reduction of power consumption in a designed hardware according to a preferred embodiment of the invention.

Further the functional situation depicted in FIG. 8 shows that never all functions are calculated at the same time. Some variables are 'don't care' and thus are not used for a pending calculation. According to the invention, these variables are transferred into Hold Register (e.g. clock gating) therefore do not consume power, because the input values are not changed. In other words does the invention enable the design of hardware with minimum power dissipation.

In the following, the functional features of a conversion algorithm according to the invention are shown guided by exemplary pseudo code samples. Hereby the design is described by use of partitions called 'BLOCKs' (equivalent to functions and subroutines). Each Block is connected to other Blocks by calling blocks or by getting called from other blocks. It is noted that the following sequence does not demonstrate the means to convert a behavioral language into a netlist but only the fundamental concepts. Further the following does not explain how to convert boolean expressions because these expressions are easy to translate since e.g. 'ANDs' and 'ORs' are the same constructs in all computer languages.

| Code for Block_A | Line number | Active state |
|---|---|---|
|  | L0 |  |
| if Bool_Expr_1 | L1 | C0 |
| Var1 = Bool_Expr_2 | L2 | C1 |
| else | L3 | C0 |
| Var1 = Bool_Expr_3 | L4 | C3 |
| call Block_B | L5 | C0 |
| if Bool_Expr_4 | L6 | C0 |
| call Block_C | L7 | C6 |
| Var2 = Bool_Expr_5 | L8 | C6 |

For the translation to a netlist it is first assumed, that each block has a corresponding input state (M_blockname). This state is generated by the translation process without additional information. For easier understanding, names for this example are composed in a simple manner, according to a fixed rule, with a scheme x_y_z:

x=always a keyword or keychar (E for expression C for state (condition) D for data input M for muxed data)
y=Linenumber for E and C names=relative position in global table for D names=omitted for M names
Z=Blockname for E and C names=variable or blockname for D and M names
Translation of example (line by line)
initialize:(before start of block translation) generate for netlist:
C_L0_Block_A=1
line 1:translate boolean expression into netlist (details not shown)
E_L1_Block_A=Bool_Expr_1
generate state in netlist for 'if' statement. Use currently active state from stack (C_L0_Block_A)
C_L1_Block_A=C_L0_Block_A and E_L1_Block_A
New active state=C_L1_Block_A
line 2:Boolean expression
E_L2_Block_A=Bool_Expr_2
Update global table for variable VAR1 at position P(X) with:
VAR1 P(X):Blk=Block_A actState=C1
Generate data input for VAR1
D_P(X)_VAR1=E_L2_Block_A
line 3:'else' sets current active condition back to C_L0_Block_A and uses same expression as 'if' but inverted
E_L3_Block_A=not ( Bool_Expr_2)
C_L3_Block_A=C_L0_Block_A and E_L3_Block_A
line 4:like line 2
input for table—>
VAR1 P(X+1):Blk=Block_A actState=C3 input for local netlist—>
E_L4_Block_A=Bool_Expr_3
D_P(X+1)_VAR1=E_L4_Block_A
line 5:A function call only updates the global table but does not generate any netlist statement. The active state after end of 'if then else' clause is now C_L0_Block_A
table—>Block_B P(Y): Blk=Block_A actState=C0
line 6: like line 1
netlist—>
E_L6_Block_A=Bool_Expr_4
C_L6_Block_A=C_L0_Block_A and E_L6_Block_A
line 7:like line 5
input table—>
Block_C P(Z): Blk=Block_A actState=C6
line 8:like line 2
table—>
VAR2 P(V): Blk=Block_A actState=C6
netlist—>
E_L8_Block A=Bool_Expr_5
D_P(V)_VAR2=E_L8_Block_A After using the algorithm for all blocks of a design accordingly, a number of local netlist statements have been generated. The final statements are generated from the global table. The subset of the global table, generated by conversion of Block_A for the above example, looks like this:

| Element | e1.Position | Block | State |
|---|---|---|---|
| VAR1 | X | Block_A | C1 |
|  | X + 1 | Block_A | C3 |
| VAR2 | V | Block_A | C6 |
| Block_B | Y | Block_A | C0 |
| Block_C | Z | Block_A | C6 |

Now for each element used by Block_A in this example, the netlist is generated. Each entry in the table provides one signal for an element. All signals are linked by means of an 'OR' statement (see FIG. 7). This represents the multiplexer in front of registers and nets.

M_VAR1=(D_P(X)_VAR1 and M_Block_A and C_L1_Block_A) or (D_P(X+1)_VAR1 and M_Block_A and C_L3_Block_A)
M_VAR2=( D_P(V)_VAR2 and M_Block_A and C_L6_Block_A)
M_Block_B=(M_Block_A and C_L0_Block_A)
M_Block_C=(M_Block_A and C_L6_Block_A)

The last three equations contain no 'OR' because they have only one input.

While the invention has been described with respect to preferred embodiments thereof, it will be understood that modifications to the disclosed embodiments can be effected without departing from the spirit of the invention as defined in the following claims.

What is claimed is:

1. A method for functionally describing a digital hardware design, comprising the steps of:

specifying the design by functions depending on variables wherein the functions contain data flow information and control flow information thereby generating a functional specification;

parsing the functional specification in order to distinguish the data flow information and the control flow information;

providing at least one local table having entries, at least a portion of the entries containing the control flow information; and providing a global table having entries, at least a portion of the entries containing the data flow information and references to the at least one local table, wherein the entries of the global table are, for given variables, function-based with the respective references to the local table such that a particular change in the design results in a change to the local table rather than to the global table.

2. The method according to claim 1, characterized in that the step of specifying the design comprises the steps of specifying control flow objects and data flow objects, and providing interconnection between the control flow objects and the data flow objects.

3. The method according to claim 2, characterized in that the step of providing the local table is based on one or more fixed rules.

4. The method according to claim 1, characterized in that the specifying step further comprises the steps of:

specifying the data flow information of the digital hardware design and structuring the data flow information into functions, and embedding these functions into control logic required in accordance with the digital hardware design.

5. The method according to claim 1, further comprising the step of executing each of said functions only once in cases where the function is called more than once.

6. The method according to claim 1, characterized in that non-perceivable states of the digital hardware design are not expressly specified in the functional specification.

7. The method according to claim 1, further comprising the step of transferring variables which are not relevant to the digital hardware design into one or more hold registers.

8. A method for converting a functional specification of a digital hardware design into a netlist, comprising the steps of:

specifying the design by functions depending on variables wherein the functions contain data flow information and control flow information thereby generating a functional specification;

parsing the functional specification in order to distinguish the data flow information and the control flow information;

providing at least one local table having entries, at least a portion of the entries containing the control flow information; and providing a global table having entries, at least a portion of the entries containing the data flow information and references to the at least one local table, wherein the entries of the global table are, for given variables, function-based with the respective references to the local table such that a particular change in the design results in a change to the local table rather than to the global table;

generating a netlist from contents of the local table and the global table, each entry of which corresponds to a variable contained in the global table.

9. The method according to claim 8, further comprising generating the netlist based only on changes in the digital hardware design.

10. The method according to claim 8, wherein local changes in the functional specification convert into respective local changes in the netlist.

11. A computer program product stored on a computer usable medium, for functionally describing a digital hardware design, comprising:

computer readable program means for causing a computer to specify the design by functions depending on variables wherein the functions contain data flow information and control flow information thereby generating a functional specification;

computer readable program means for causing the computer to parse the functional description in order to distinguish the data flow information and the control flow information;

computer readable program means for causing the computer to generate at least one local table having entries, at least a portion of the entries containing the control flow information; and computer readable program means for causing the computer to generate a global table having entries, at least a portion of the entries containing the data flow information and references to the at least one local table, wherein the entries of the global table are, for given variables, function-based with the respective references to the local table such that a particular change in the design results in a change to the local table rather than to the global table.

12. A computer program product stored on a computer usable medium for converting a functional specification of a digital hardware design into a netlist, comprising:

computer readable program means for causing a computer to specify the design by functions depending on variables wherein the functions contain data flow information and control flow information thereby generating a functional specification;

computer readable program means for causing the computer to parse the functional description in order to distinguish the data flow information and the control flow information;

computer readable program means for causing the computer to generate at least one local table having entries, at least a portion of the entries containing the control flow information;

computer readable program means for causing the computer to generate a global table having entries, at least a portion of the entries containing the data flow information and references to the at least one local table, wherein the entries of the global table are, for given variables, function-based with the respective references to the local table such that a particular change in the design results in a change to the local table rather than to the global table; and computer readable program means for causing the computer to generate a netlist from contents of the local table and the global table, each entry of which corresponds to a variable contained in the global table.

13. A method for functionally describing a digital hardware design, comprising the steps of:

specifying the design by functions, excluding logically non-perceivable functions, depending on variables wherein the functions contain data flow information and control flow information thereby generating a functional specification, by specifying control flow objects and data flow objects, and providing interconnection between the control flow objects and the data flow objects;

parsing the functional specification in order to distinguish the data flow information and the control flow information;

generating at least one local table having entries, using fixed rules, at least a portion of the entries containing the control flow information; and providing a global table having entries, at least a portion of the entries containing the data flow information and references to the at least one local table, wherein the entries of the global table are, for given variables, functions together with respective references in the local table such that a particular change in the design results in a change to the local table rather than to the global table.

14. A system for functionally describing a digital hardware design, comprising:

means for specifying the design by functions depending on variables wherein the functions contain data flow information and control flow information thereby generating a functional specification;

means for parsing the functional specification in order to distinguish the data flow information and the control flow information;

means for providing at least one local table having entries, at least a portion of the entries containing the control flow information; and means for providing a global table having entries, at least a portion of the entries containing the data flow information and references to the at least one local table, wherein the entries of the global table are, for given variables, function-based with the respective references to the local table such that a particular change in the design results in a change to the local table rather than to the global table.

* * * * *